United States Patent [19]

Brown

[11] Patent Number: 4,736,277

[45] Date of Patent: Apr. 5, 1988

[54] METAL PRINTED CIRCUIT PANELS INCLUDING MESAS FOR COUPLING CIRCUITRY THEREON TO SIGNAL GROUND

[75] Inventor: Vernon L. Brown, Barrington, Ill.

[73] Assignee: Motorola, Inc., Schaumburg, Ill.

[21] Appl. No.: 99,627

[22] Filed: Sep. 22, 1987

Related U.S. Application Data

[63] Continuation of Ser. No. 816,024, Jan. 3, 1986, abandoned.

[51] Int. Cl.[4] .............................................. H05K 9/00
[52] U.S. Cl. ..................................... 361/424; 29/840; 29/846; 361/388; 361/400; 455/51
[58] Field of Search .......................... 29/825, 840, 846; 174/68.5, 16 HS; 361/383–384, 386–389, 400, 401, 403, 414, 424; 429/96–98, 100; 455/346–349, 351

[56] References Cited

U.S. PATENT DOCUMENTS

| | | | |
|---|---|---|---|
| 1,641,395 | 9/1927 | Moore | 361/424 |
| 2,683,839 | 7/1954 | Beck | 317/101 |
| 3,024,151 | 3/1962 | Robinson | 156/150 |
| 3,465,435 | 9/1969 | Steranko | 29/628 |

FOREIGN PATENT DOCUMENTS

0391762 11/1973 U.S.S.R. ............................ 361/424

OTHER PUBLICATIONS

John F. Dennis-Browne, "Circuit Board Technology", Printed Circuit Fabrication, vol. 8, No. 7, Jul. 1985, pp. 28–37.

*Primary Examiner*—Philip H. Leung
*Assistant Examiner*—Gregory D. Thompson
*Attorney, Agent, or Firm*—Rolland R. Hackbart

[57] ABSTRACT

A unique housing (104) or a portable radio transceiver (100) is described that includes unique metal printed circuit panels providing for grounding and heat sinking of electrical components and circuitry thereon, and a battery as a structural element thereof. In one illustrated housing (104), three printed circuit panels (212, 213 and 214) and a stick battery (210) are held together by interlocking side rails (206,207). The unique printed circuit panels (212, 213, and 214) include mesas (422) that protrude through corresponding holes in the dielectric and circuitry layers (404 and 406) laminated on the panel. The mesas (422) are preferably soldered to the circuitry layer or electrical components thereon. The shape and size of the mesas (422) can be varied to provide the desired grounding and/or heat sinking. The unique metal printed circuit panel of the present invention may be advantageously utilized in a variety of applications including battery-operated radio transceivers, such as, for example, cellular radiotelephone systems and trunked radio systems.

4 Claims, 3 Drawing Sheets

METAL PRINTED CIRCUIT PANELS INCLUDING MESAS FOR COUPLING CIRCUITRY THEREON TO SIGNAL GROUND

This application is a continuation of application Ser. No. 816,024 filed Jan. 3, 1986, now abandoned.

BACKGROUND ART

The present invention is generally related to printed circuit boards and more particularly related to an improved apparatus for coupling circuitry on metal printed circuit panels to signal ground.

In the prior art, printed circuit boards were typically comprised of various types of glass materials. In order to provide continuity from top to bottom surfaces of such printed circuit boards, plated through holes and eyelets were used. A stripline circuit requires a circuit board having a ground plane on its outer surfaces. Furthermore, in order to dissipate heat generated by electrical components on such circuit boards, heat sinks comprised of metal were mounted on the circuit board and thermally coupled to the heat-generating component. However, none of the prior art circuit boards provided a means for easily grounding and heat sinking electrical components and circuitry thereon.

OBJECTS AND SUMMARY OF THE INVENTION

Accordingly, it an object of the present invention to provide an improved, low cost metal printed circuit panel that includes mesas for coupling circuitry thereon to signal ground.

It is another object of the present invention to provide an improved metal printed circuit panel that includes mesas for both electrically and thermally coupling circuitry thereon to the underlying metal panel.

Briefly described, the present invention encompasses improved apparatus for coupling electronic circuitry to a grounded surface of a metallic housing panel. The improved apparatus includes a plurality of mesas protruding from the grounded surface of the metallic housing panel; a dielectric layer bonded to the metallic housing panel and including a plurality of holes, each of said mesas protruding through a corresponding one of said holes; a circuitry layer bonded to the dielectric layer, having the electronic circuitry thereon and including a plurality of holes, each of said mesas protruding at least partially through a corresponding one of said holes; and means for producing electrical signal continuity between the electronic circuitry on one of the circuitry layers and said mesas.

DETAILED DESCRIPTION OF THE PREFERRED EMBODIMENT

Figure 1:
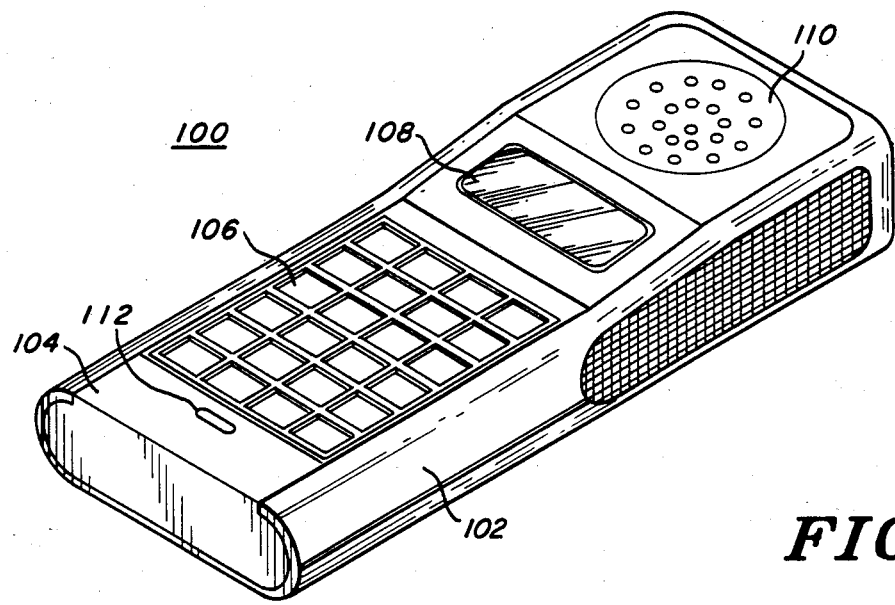
FIG. 1 is a perspective view of a portable radio transceiver that may advantageously utilize the present invention.

In FIG. 1, there is illustrated a perspective view of a portable radio transceiver 100 that may advantageously utilize the present invention. Transceiver 100 includes an outer covering 102 preferably of compliant plastic and an inner shell or housing 104 preferably comprised of sheet metal. Transceiver 100 also includes keyboard 106, display 108, speaker 110 and microphone port 112 for communicating in a radio system. Transceiver 100 may be advantageously utilized in a variety of radio systems, such as, for example, cellular radiotelephone systems and trunked radio systems.

Figure 2:
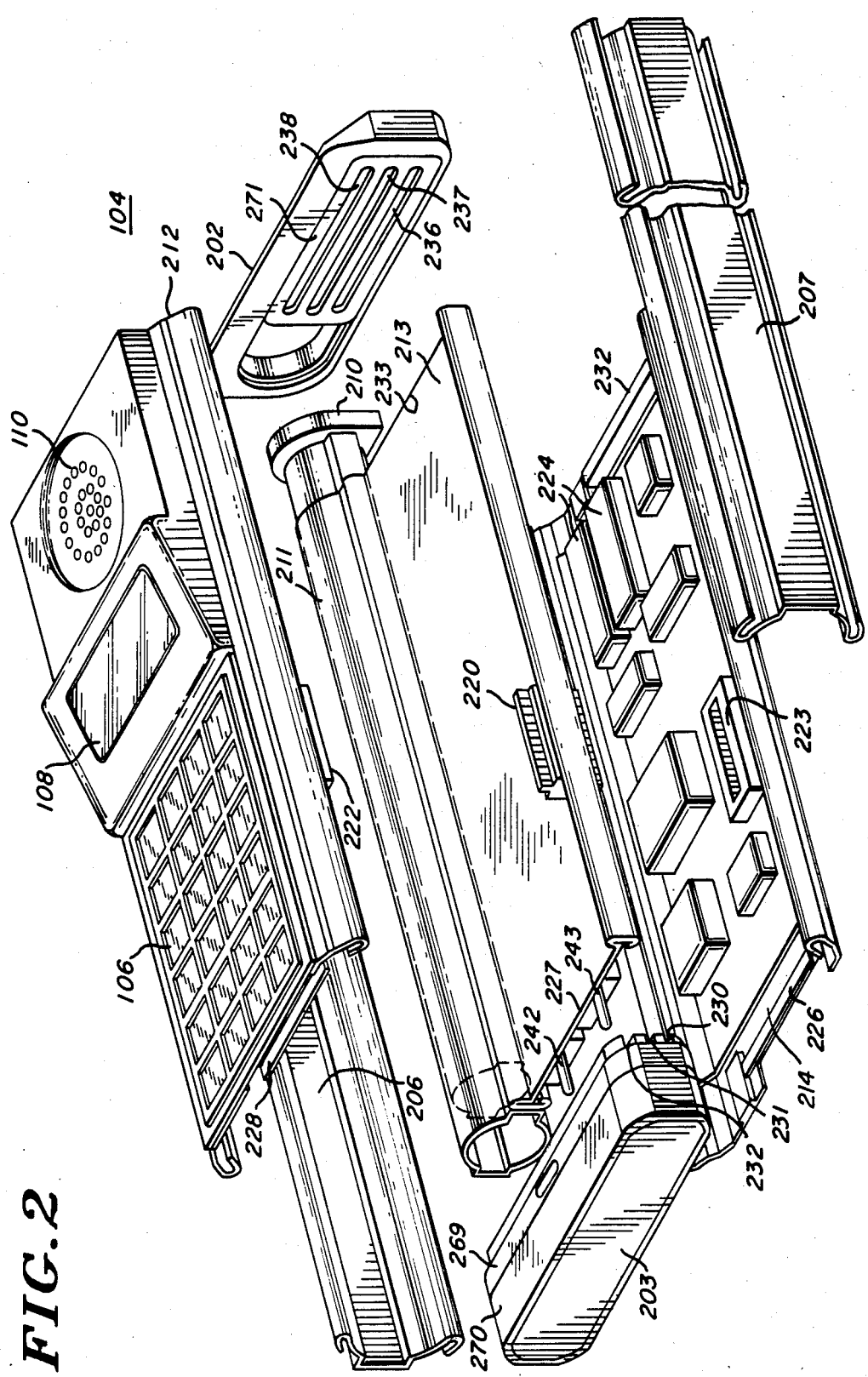
FIG. 2 is an exploded perspective view of the housing of the portable radio transceiver in FIG. 1 with parts broken away.

Referring next to FIG. 2, there is illustrated an exploded perspective view of the housing 104 in the portable radio transceiver 100 in FIG. 1. A stick battery 210 inserts into housing 104 and is a structural element thereof. The elements of housing 104 may be made of light-weight sheet metal since battery 210 contributes significantly to the structural strength of the housing. In the preferred embodiment of transceiver 100, battery 210 includes three to five individual cells which are stacked together as a stick.

Housing 104 in FIG. 2 includes three printed circuit panels 212, 213 and 214, a stick battery 210, a battery tube 211, side rails 206 and 207 and end caps 202 and 203. In the preferred embodiment illustrated in FIG. 2, panels 212, 213 and 214, side rails 206 and 207 and battery tube 211 are made of sheet metal, and the exterior portions of end caps 202 and 203 are made of plastic and metal. Panel 212 is the logic printed circuit panel and includes on one side keyboard 106 and display 108, and on the other side electronic circuitry, which performs the signalling and control functions of the portable transceiver 100. The electronic circuitry on each of the panels 212, 213 and 214 includes surface-mountable electrical components 224 soldered to an electrical circuitry layer, which together with a dielectric layer is laminated to panel 212 (shown in more detail in FIG. 4).

Panel 213 in FIG. 2 is the transmitter printed circuit panel and includes male connector 220 which interconnects panels 212, 213 and 214, and on one side electronic circuitry, which is the radio frequency (RF) transmitter of the portable transceiver 100. Male connector 220 extends on both sides of panel 213 for coupling control, RF and audio signals by way of corresponding female connectors 222 and 223 between the transmitter circuitry, logic circuitry and receiver circuitry (shown in more detail in FIGS. 8 and 9). Panel 213 also includes two connecting pins 242 and 243 that couple transmitter and receiver RF signals to serpentine antenna that is located in end cap 203 (shown in more detail in FIG. 3). Panel 213 has an I-beam cross-section for imparting strength to housing 104. One side of panel 213 inserts into a channel in battery tube 211 for structurally coupling panel 213 to battery 210. In the preferred embodiment illustrated in FIG. 2, battery 210 and tube 211 have canted sides 240 and 241 for resisting torsionally applied forces. These features of battery 210, tube 211 and panel 213 are illustrated in more detail in the cross-sectional view in FIG. 3.

Panel 214 in FIG. 2 is the receiver printed circuit panel and includes on one side electronic circuitry, which is the RF receiver of the portable transceiver 100. Panel 214 includes flanges 226 and 232 which insert into slots 230 and 236 in end caps 203 and 202, respectively, for positioning and retaining panel 214 in housing 104. Similarly, edges 227 and 233 of panel 213 insert into slots 231 and 237 in end caps 203 and 202, respectively, for positioning and retaining panel 213 in housing 104; and another flange (similar to flange 228 but not shown) which insert into slots 232 and 238 in end caps 203 and 202, respectively, for positioning and retaining panel 212 in housing 104. Once panels 212, 213 and 214 in FIG. 2 are positioned in end caps 202 and 203, side rails 206 and 207 may be slipped onto the edges of panels 212, 213 and 214 for completing assembly of housing 104. The elements of housing 104 are essentially held together by interlocking geometry which causes side rails 206 and 207 and panels 212, 213 and 214 to be one structure. End cap 202 includes a battery retaining tab (not shown) and metal plate 271 which has slots 236, 237 and 238. Metal plate 271 is connected to end cap 202 by screws (not shown) or adhesive. End cap 203 (shown in more detail in FIG. 5) has an outer portion 270 which is connected to inner portion 269 by screws (not shown) or adhesive. Once assembled, housing 104 is slipped into outer covering 102. Thus, transceiver 100 may be quickly and easily assembled without using screws.

Figure 3:
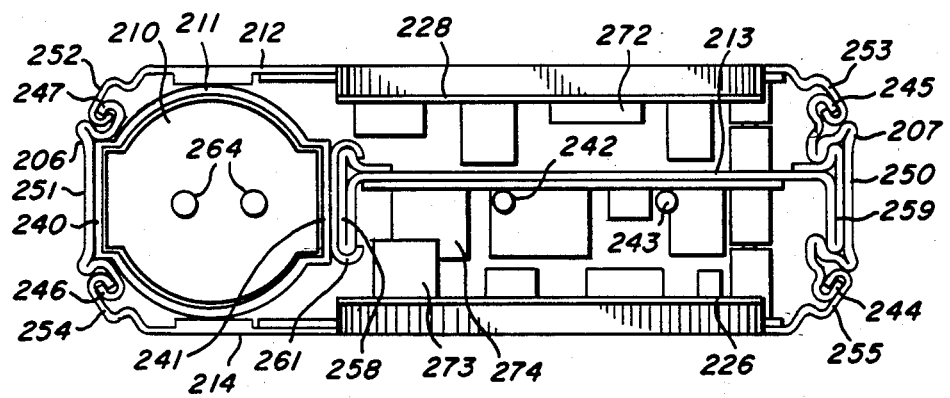
FIG. 3 is an end view of the portable radio transceiver housing in FIG. 2.

Referring next to FIG. 3, there is illustrated an end view of housing 104 where end cap 203 has been removed. The center portion 250 of side rail 207 is shaped to capture the I-beam side 259 of panel 213. The center portion 251 of side rail 206 is shaped to fit over side 240 of battery tube 211. In other embodiments, center portion 251 of side rail 206 may be shaped to capture canted side 240 of battery tube 211. Battery tube 211 includes side rail 261 shaped to capture the I-beam side 258 of panel 213. Side rail 261 is attached by spot welding or other suitable means to canted side 241 of battery tube 211. Contacts 264 on battery 210 feed a DC voltage to the electronic circuitry by way of contacts on end cap 203 which in turn are coupled to leaf contacts (not shown) that connect to corresponding pads on the transmitter circuitry on panel 213 when housing 104 is assembled. Pins 242 and 243 couple transmitter and receiver signals to an antenna located in end cap 203 (shown in more detail in FIG. 5). Flanges 226 and 228 insert into slots 230 and 232, respectively, in end cap 203 as explained hereinabove with respect to FIG. 2.

The edges 244–247 of side rails 206 and 207 in FIG. 3 include channels which slide into corresponding channels in the edges 252–255 of panels 212 and 214. The center portion 250 of side rail 207 is also shaped to capture the I-beam side 259 of panel 213. According to a feature of transceiver 100, the edges 244–247 of side rails 206 and 207 are also shaped to exert a spring force on the edges 252–255 of panels 212 and 214 when housing 104 is assembled. Furthermore, panels 212, 213 and 214 are strengthened by battery 210 since battery 210 is a structural element of housing 104. As a result, panels 212, 213 and 214 may be made out of sheet metal.

The electronic circuitry on each of the panels 212, 213 and 214 is also illustrated in greater detail in FIG. 3. The logic circuitry on panel 212 includes components 272 which, in the preferred embodiment, are soldered to an electrical circuitry layer, which together with a dielectric layer is laminated to panel 212 (shown in more detail in FIG. 4). Similarly, the transmitter circuitry on panel 213 includes components 274, and the receiver circuitry on panel 214 includes components 273. The components 272 on panel 212 are electrically shielded from the RF signals on panels 213 and 214 since panels 212, 213 and 214 are preferably made of sheet metal and are coupled to signal ground. Furthermore, large components such as component 273 on panel 214 and component 274 on panel 213 may be offset relative to one another such that they may have a vertical length slightly less than the vertical distance between panels 212 and 214.

Figure 5:
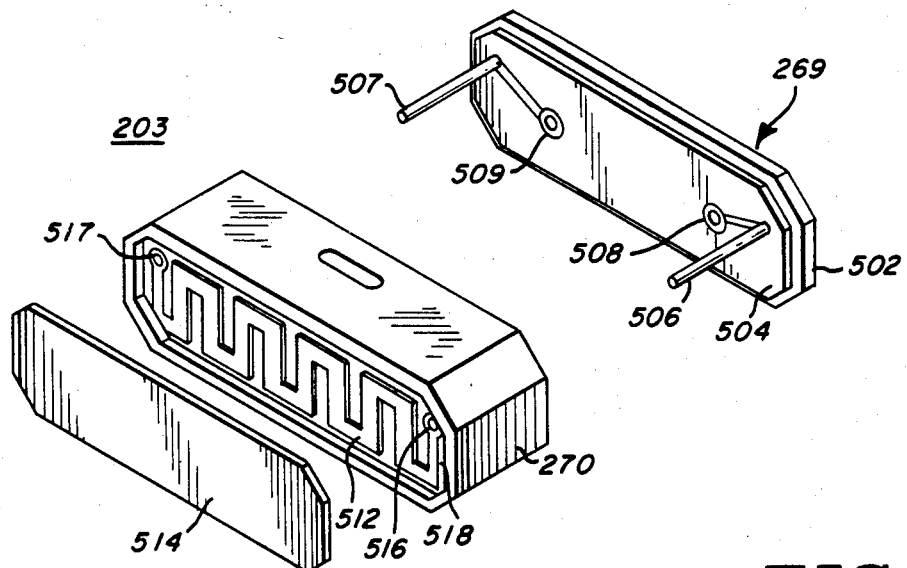
FIG. 5 is an exploded perspective view of the end cap of the portable radio transceiver housing in FIG. 2.

Referring next to FIG. 5, there is illustrated an exploded perspective view of end cap 203 of the portable radio transceiver housing 104 in FIG. 2. End cap 203 includes serpentine antenna therein for transmitting and receiving RF signals. End cap includes inner portion 269, outer portion 270 and cover 514. Inner portion 269 includes metal ground plane 502 and circuit board 504. Circuit board 504 includes posts 506 and 507 which are coupled by stripline circuitry to receptacles 509 and 508, respectively. Outer portion 270 of end cap 203 includes a circuit board 518 having a serpentine loading circuit 512. The serpentine loading circuit 512 is formed by a zig-zag stripline. Pins 242 and 243 on panel 213 in FIG. 2 insert into receptacles 509 and 508, respectively for connecting the transmitter and receiver circuitry to the antenna formed by posts 506 and 507 and serpentine loading circuitry 512. The foregoing antenna circuitry is described in more detail in copending U.S. patent application, Ser. No. 558,270 (now U.S. Pat. No. 4,571,595, filed Dec. 5, 1983, entitled "Dual Band Transceiver Antenna" and invented by James P. Phillips and Henry L. Kazecki, which application is incorporated herein in its entirety by reference thereto.

Figure 4:
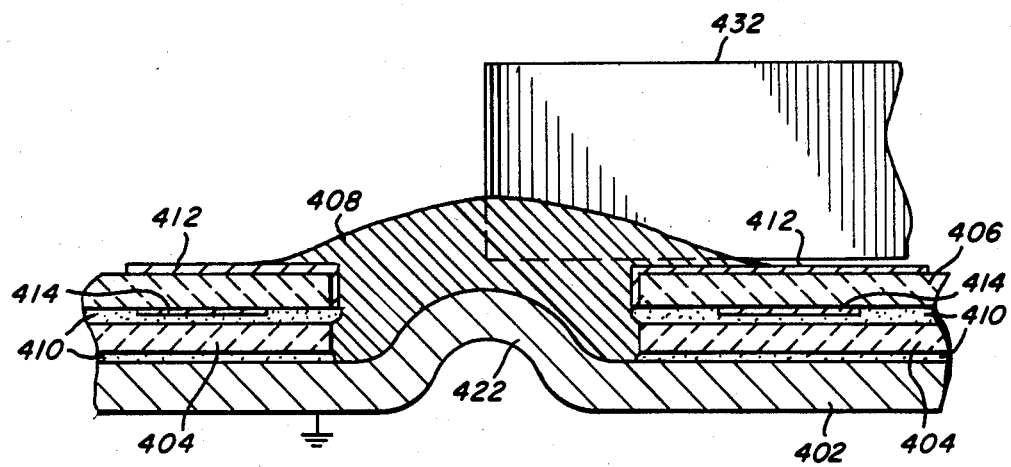
FIG. 4 is a partial cross-sectional view of a printed circuit panel embodying the present invention and advantageously utilized in the portable radio transceiver housing in FIG. 2.

In FIG. 4, there is illustrated a partial cross-sectional view of printed circuit panel 402 embodying the present invention and representative of printed circuit panels 212, 213 and 214 in the portable radio transceiver housing 104 in FIG. 2. The representative printed circuit panel 402 in FIG. 4 includes an electrical circuitry layer 406 and a dielectric layer 404 which are colaminated to panel 402. Any suitable adhesive 410 may be utilized to laminate or bond dielectric layer 404 to panel 402 and to bond electrical circuitry layer 406 to dielectric layer 404. Electrical circuitry layer 406 includes conductive plating 412 on the top and/or bottom surface thereof for providing pads for mounting electrical components 432 and connectors, and providing circuit paths for electrical signal continuity between such electrical components and connectors. Components 432 are preferably surface mount components similar to those shown and described in copending U.S. patent application, Ser. No. 759,399, filed July 26, 1985, entitled "Surface Mount Component for Heat Sensitive Electrical Devices" and invented by Vernon L. Brown, which application is incorporated herein in its entirety by reference thereto.

Panel 402 in FIG. 4 includes a plurality of mesas 422 which are indentations extending up between corresponding holes in the dielectric layer 404 and electrical circuitry layer 406. Mesas 422 protrude through corresponding holes in the dielectric layer 404 and at least partially through corresponding holes in electrical circuitry layer 406. Mesas 422 are preferably bonded by solder 408 to plating 412. In the preferred embodiment, mesas 422 have a height of approximately 0.20 inches and a diameter of 0.040 inches; metal panel 402 has a thickness of 0.015 inches; dielectric layer has a thickness of 0.010 inches; and electrical circuitry layer has a thickness of 0.010 inches. Since panel 402 is preferably made of a conductive metal and coupled to signal ground, mesas 422 couple signal ground via solder 408 to plating 412 on the top surface of layer 406. Furthermore, stripline transmission lines 414 may be produced between grounded plating 412 and grounded metallic panel 404. Stripline transmission lines 414 may be used to provide signal paths in a high frequency circuit, such as those found in RF signal transmitters and receivers. Moreover, in addition to providing signal ground connections, mesas 422 also provide paths for the transfer of dissipated heat from an electrical component 432 on layer 406 to metal panel 402. When mesas 422 are used for heat sinking purposes, the electrical component 432 dissipating the heat may be mounted at least partially on one or more mesas 422, and the mesas 422 may be elongated slots or rectangular indentations or may be indentations shaped to conform to a particular component.

The stick battery 210 in FIG. 2 functions as a structural element of the housing since it picks up a significant portion of applied inertial and static loads. By means of the canted surfaces 240 and 241 of battery 210 in FIG. 3, the torsional strength of the stick battery 210 is used to resist rotational torques applied along the length of housing 104 (X-axis). Similarly, a torque about the Y-axis (width) or a load along the Z-axis (height) is resisted by canted surfaces 240 and 241, side rail 261 and battery tube 211 when sufficient deflection of tube 211 occurs for battery 210 to be loaded as a beam. A load along the Y-axis is resisted by canted surfaces 240 and 241 and by battery 210 when tube 211 is deflected such that it bears on battery 210.

A multi-cell battery, such as battery 210 in FIG. 2, may be implemented by two methods. In both methods, some form of liquid or gas tight cell enclosure is required to electro-chemically separate each cell from the other. First, a very weak or thin outer enclosure only sufficient to maintain the moisture of each cell could be provided around each electrode set thereof. Such cells would be installed into a battery tube or housing which provides the strength needed to contain the contents of the cells and also acts as an a structural element of the housing. Secondly, individual cells may be provided with individually strong enclosures which when coupled together act as an a structural element of the housing.

In summary, a unique metal printed circuit panel has been described that provides for grounding and heat sinking electrical components and circuitry thereon. The unique panel includes mesas that protrude through corresponding holes in the dielectric and circuitry layers laminated on the panel. The mesas are preferably soldered to the circuitry layer and/or electrical components on the panel. The shape and size of the mesas can be varied to provide the desired grounding and/or heat sinking. The unique metal printed circuit panel of the present invention may be advantageously utilized in a variety of applications including battery-operated radio transceivers, such as, for example, cellular radiotelephone systems and trunked radio systems.

I claim:

1. Apparatus comprising in combination:
   a metallic housing panel having a grounding surface;
   a plurality of mesas protruding from the grounding surface of the metallic housing panel;
   a dielectric layer bonded to the grounding surface of the metallic housing panel and including a plurality of holes, each of said mesas protruding through a corresponding one of said holes;
   a circuitry layer bonded to the dielectric layer and including a plurality of holes, each of said mesas protruding at least partially through a corresponding one of said holes;
   electronic circuitry bonded to the circuitry layer; and
   means for coupling the electronic circuitry on the circuitry layer to said plurality of mesas.

2. The apparatus according to claim 1, wherein said electronic circuitry includes at least one surface-mount device bonded to said circuitry layer.

3. A method of coupling electronic circuitry to a grounding surface of a metallic housing panel, said method comprising the steps of:
   producing a plurality of mesas protruding from the grounding surface of the metallic housing panel;
   bonding a dielectric layer to the grounding surface of the metallic housing panel, said dielectric layer including a plurality of holes, and each of said mesas protruding through a corresponding one of said holes;
   bonding a circuitry layer to the dielectric layer, said circuitry layer including a plurality of holes, and each of said mesas protruding at least partially through a corresponding one of said holes;
   bonding electronic circuitry to said circuitry layer; and
   coupling the electronic circuitry on the circuitry layer to said plurality of mesas.

4. The method according to claim 3, wherein said electronic circuitry bonding step includes the step of bonding at least one surface-mount device to said circuitry layer.

* * * * *